US007983020B2

(12) United States Patent
Min et al.

(10) Patent No.: US 7,983,020 B2
(45) Date of Patent: Jul. 19, 2011

(54) CARBON NANOTUBE COATED CAPACITOR ELECTRODES

(75) Inventors: Yongki Min, Phoenix, AZ (US);
Daewoong Dave Suh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/661,568

(22) Filed: Mar. 19, 2010

(65) Prior Publication Data

US 2010/0177475 A1     Jul. 15, 2010

Related U.S. Application Data

(63) Continuation of application No. 11/694,909, filed on Mar. 30, 2007, now Pat. No. 7,710,709.

(51) Int. Cl.
*H01G 4/228* (2006.01)

(52) U.S. Cl. ............... 361/306.2; 361/311; 361/313; 361/305; 361/306.1; 361/306.3

(58) Field of Classification Search .............. 361/306.2, 361/306.1, 306.3, 502–504, 509–512, 303–305, 361/311–313
See application file for complete search history.

(56) References Cited

U.S. PATENT DOCUMENTS

| 5,815,144 | A  | * | 9/1998 | Strothmann | 715/717 |
| 7,482,652 | B1 | * | 1/2009 | Yang | 257/314 |
| 7,492,046 | B2 | * | 2/2009 | Furukawa et al. | 257/758 |
| 2008/0003768 | A1 | * | 1/2008 | Oh | 438/399 |
| 2008/0142866 | A1 | * | 6/2008 | Choi et al. | 257/309 |

* cited by examiner

*Primary Examiner* — Nguyen T Ha
(74) *Attorney, Agent, or Firm* — Kathy J. Ortiz

(57) ABSTRACT

Devices and methods for their formation, including electronic devices containing capacitors, are described. In one embodiment, a device includes a substrate and a capacitor is formed on the substrate. The capacitor includes first and second electrodes and a capacitor dielectric between the first and second electrodes. At least one of the first and second electrodes includes a metal layer having carbon nanotubes coupled thereto. In one aspect of certain embodiments, the carbon nanotubes are at least partially coated with an electrically conductive material. In another aspect of certain embodiments, the substrate comprises an organic substrate and the capacitor dielectric comprises a polymer material. Other embodiments are described and claimed.

9 Claims, 3 Drawing Sheets

CARBON NANOTUBE COATED CAPACITOR ELECTRODES

RELATED ART

One application of the use of capacitors in electronic devices is for de-coupling during power delivery to electronic components such as central processing units (CPU's). Such capacitors may be formed with an embedded structure, and should generally be formed to provide high capacitance, while also being formed from materials that provide minimal thermal expansion mismatch problems with the underlying substrate.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to capacitors formed for electronic devices, including embedded capacitors formed on a substrate. Embodiments include both devices and methods for forming electronic devices including capacitors.

Certain embodiments may find application as de-coupling capacitors used in power deliver applications such as delivering power to a CPU. For the high capacitance desired in CPU de-coupling capacitors, ceramic thin film capacitors have been investigated. However, the use of ceramic thin film capacitors may be problematic due to thermal expansion mismatch, damage to the ceramic during etching and via formation processes, high processing temperatures required, and alignment accuracy when attaching a separately fabricated ceramic thin film capacitor to a substrate. For example, ceramic capacitors may have an undesirable thermal expansion mismatch with organic substrates.

Figure 1:
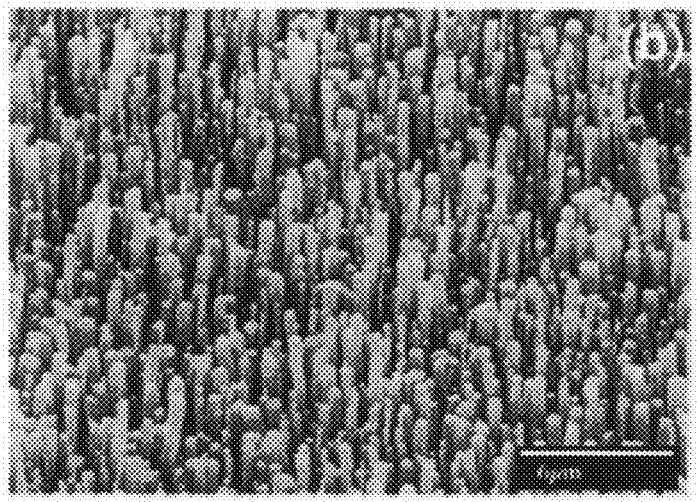
FIG. 1 illustrates a micrograph of carbon nanotubes formed on a substrate according to the Prior Art.

FIG. 1 illustrates a photomicrograph of a multi wall carbon nanotube (MWCNT) array grown on a substrate. The carbon nanotubes have a structure that includes a relatively large surface area.

Figure 2:
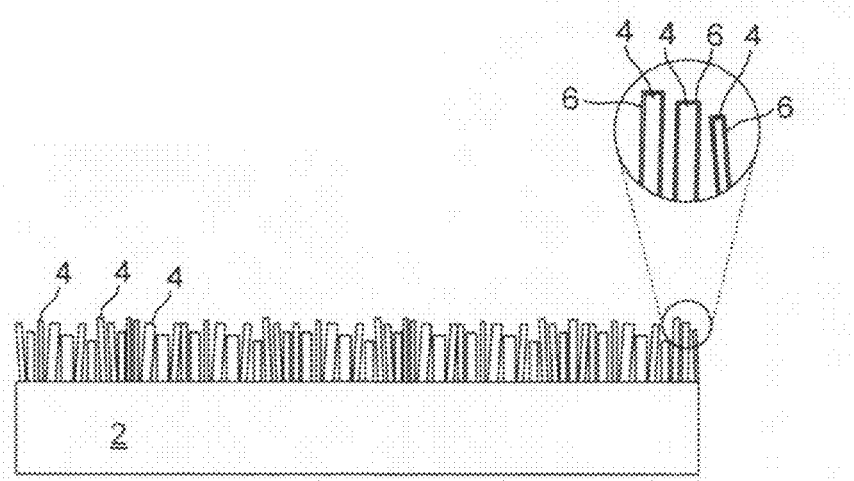
FIG. 2 illustrates a side view illustrating an electrode structure including carbon nanotubes extending outward from a metal surface, in accordance with certain embodiments.

FIG. 2 illustrates a schematic side view of carbon nanotubes 4 formed on a metal layer 2, in accordance with certain embodiments. The carbon nanotubes 4 may include a electrically conducting layer 6, such as a metal, formed thereon, to increase the electrical conductivity of the carbon nanotube surface. The carbon nanotubes 4 may be used as part of a capacitor electrode structure, for example, the structure illustrated in FIG. 3(D). The carbon nanotubes 4 grow outward from the substrate 2 surface in a substantially perpendicular manner (including some that are 90 degrees to the surface, some that are angled slightly from 90 degrees, and/or some that are curved). The carbon nanotubes 4 provide a substantially larger exposed surface area than a conventional capacitor electrode surface. For instance, an electrode having carbon nanotubes may in certain cases have a surface area some 400-30,000 times greater than a flat surface electrode capacitor. Carbon nanotubes may be grown using a suitable method such as plasma-enhanced chemical vapor deposition (PECVD). Catalysts are generally used to assist in the nanotube growth, and it is believed that metals including, but not limited to, nickel, iron, cobalt, molybdenum, and ruthenium, and their compounds, are effective catalysts. As a result, such metals may be applied to a substrate surface, for example, copper, using a suitable formation process such as, for example, a physical vapor deposition (PVD) process, and then the carbon nanotubes formed thereon. Alternatively, the carbon nanotubes may be formed directly onto metallic substrates or foils formed from such materials. The layer 6 may be formed on the nanotubes using any suitable formation process, for example, a vapor deposition or a plating process. In certain embodiments, the layer 6 may be formed from a metal such as copper or gold.

Due to the large surface area of the carbon nanotubes 4, a large capacitance may be obtained when using a relatively low dielectric constant material as the capacitor dielectric. For instance, ceramic dielectric materials with high dielectric constants are often used for high capacitance capacitors. In certain embodiments, the use of the carbon nanotubes permits high capacitance to be obtain when using polymer dielectric materials having a lower dielectric constant than ceramic dielectric materials. For example, due to the larger surface area of the electrode with carbon nanotubes coupled thereto, in certain embodiments, a polymer dielectric having a dielectric constant of 5 may be used, whereas in a conventional ceramic thin film dielectric capacitor, a ceramic material having a dielectric constant of 1000 may be used. As a result, it is believed that in certain applications, embodiments of embedded capacitors having a polymer dielectric and one or more carbon nanotube coated electrodes can be used as an alternative to multi-layer ceramic chip (MLCC) capacitors.

Figure 3A:
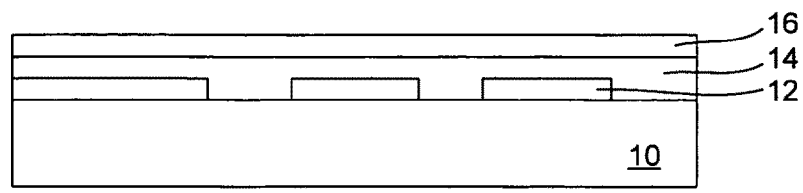
FIGS. 3(A)-3(D) illustrate certain processing operations for forming a plurality of capacitor regions on a substrate, in accordance with certain embodiments.

FIGS. 3(A)-3(D) illustrate operations in a process for forming an electronic device including embedded capacitors, in accordance with certain embodiments. The capacitors include at least one capacitor electrode having carbon nanotubes coupled thereto. A substrate 10 includes a metal layer 12 formed thereon. The substrate 10 may in certain embodiments be a multilayer organic substrate. As illustrated in FIG. 3(A), the metal layer 12 may be patterned and etched to include openings therein to electrically isolate devices to be formed in subsequent operations. An interlayer dielectric layer 14 is formed on the metal layer 12 and extends into the openings in the metal layer 12.

Figure 3B:
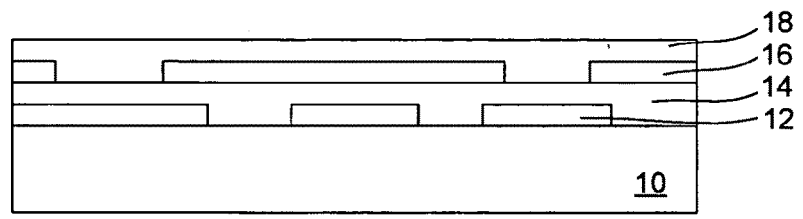
Figure 3C:
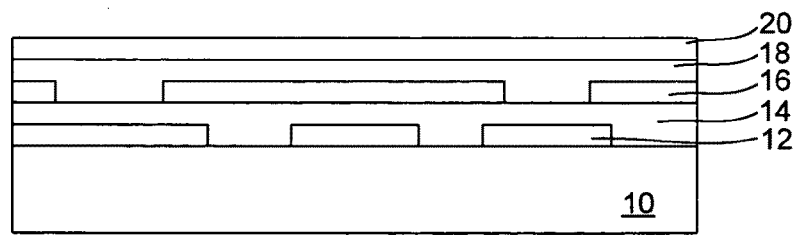

A lower capacitor electrode layer 16 is formed on the interlayer dielectric layer 14. The electrode layer 16 may be patterned and etched to form openings therein, as illustrated in FIG. 3(B). A capacitor dielectric layer 18 is then formed on the lower capacitor electrode layer 16 and may extend into the openings of the lower capacitor electrode layer 16. The upper capacitor electrode layer 20 is then formed on the capacitor dielectric layer 18, as illustrated in FIG. 3(C). The various layers may be laminated together using a suitable lamination method using pressure and heat.

Figure 3D:
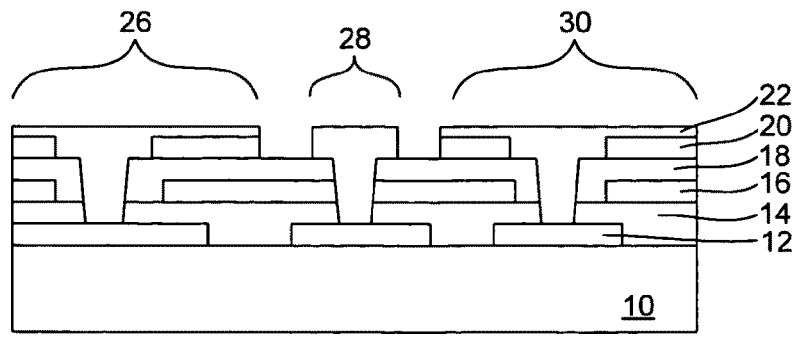

The upper capacitor electrode layer 20 may then be patterned and etched and/or laser drilled to form vias extending through multiple layers to contact the metal layer 12 on the substrate 10. Electrical connection may be made from a metal region 22 formed on the capacitor electrode layer 20, through the vias extending through upper capacitor layer 20, the capacitor dielectric layer 18, lower capacitor electrode layer 16, and the interlayer dielectric layer 14, to contact the metal layer 12. These operations may be controlled to form a device including two capacitor regions 26 and 30, separated by a ground region 28, as illustrated in FIG. 3(D).

The capacitor electrode layers on which the carbon nanotubes are formed may be formed from a variety of electrically conducting materials, including those described above as good catalyst materials for the formation of carbon nanotubes, including, but not limited to nickel, iron, cobalt, molybdenum, and ruthenium, as well as other metals such as copper and copper alloys having a suitable catalyst formed thereon. In certain embodiments, the electrode layers 16 and 20 may be formed separately with the carbon nanotubes, and then positioned on the substrate as illustrated in FIGS. 3(A) and 3(C). Alternatively, for example, a metal layer could be deposited onto the interlayer dielectric layer, and then the carbon nanotubes grown onto the metal layer, to form the electrode layer 16.

The capacitor dielectric may be formed from a variety of electrically insulating materials, including ceramics and polymers. To minimize thermal expansion mismatch when using an organic substrate, certain embodiments utilize polymer dielectric materials. One example of a polymer dielectric material which may be used is ABF (Ajinomoto Build-up Film).

It should be appreciated that variations to the operations described above are possible. For example, the entire capacitor may be separately formed and then laminated as a unit to the substrate, instead of being formed layer by layer. One or both electrodes may be formed to include the carbon nanotubes, depending on various factors such as, for example, the desired capacitance. In alternative embodiments, certain operations may be performed in a different order, modified or removed. Moreover, operations may be added to the above described process and still conform to the described embodiments. For example, additional layers may be formed on top of the capacitor structures in the electronic device. One example may include forming embedded capacitors with additional layers of electrodes and dielectric, to achieve higher capacitance. Other examples may form other types of electronic devices above or below the embedded capacitors. Embodiments may include a variety of different structural configurations than those illustrated in FIGS. 3(A)-3(D). In addition, as used herein, the term metal includes pure metals and alloys.

Assemblies as described in embodiments above may find application in a variety of electronic components. In certain embodiments, a device or devices in accordance with the present description may be embodied in a computer system including a video controller to render information to display on a monitor coupled to the computer. The computer system may comprise one or more of a desktop, workstation, server, mainframe, laptop, handheld computer, handheld gaming device, handheld entertainment device (for example, a video player), PDA (personal digital assistant), telephony device (wireless or wired), etc. Alternatively, a device or devices in accordance with the present description may be embodied in a computing device that does not include a video controller, such as a switch, router, etc.

Figure 4:
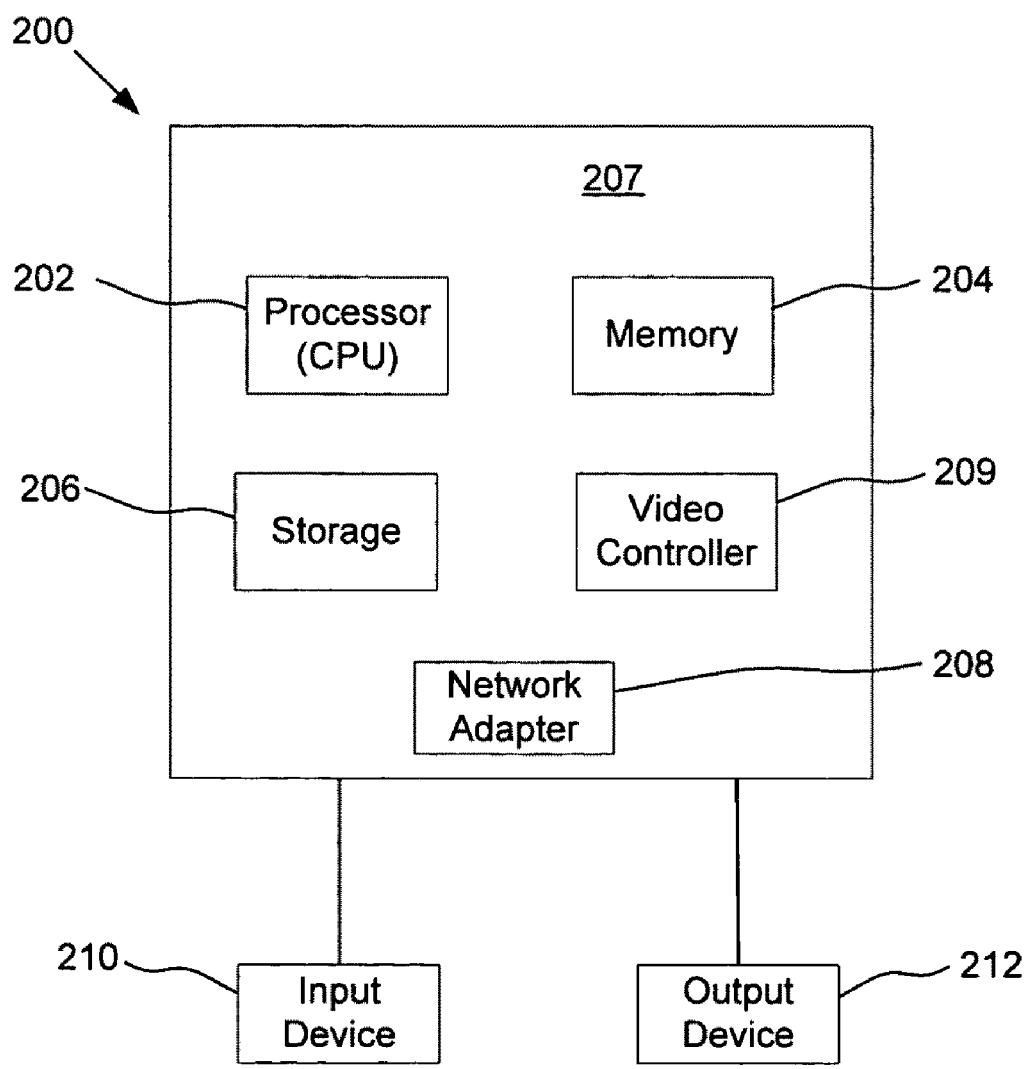
FIG. 4 illustrates an electronic system arrangement in which certain embodiments may find application.

FIG. 4 schematically illustrates one example of an electronic system environment in which aspects of described embodiments may be embodied. Other embodiments need not include all of the features specified in FIG. 4, and may include alternative features not specified in FIG. 4. FIG. 4 illustrates an embodiment of a device including a computer architecture 200 which may utilize integrated circuit devices having a structure including capacitors formed in accordance with embodiments as described above. The architecture 200 may include a CPU 202, memory 204 (including, for example, a volatile memory device), and storage 206 (including, for example, a non-volatile storage device, such as magnetic disk drives, optical disk drives, etc.). The CPU 202 may be coupled to a printed circuit board 207, which in this embodiment, may be a motherboard. The CPU 202 is an example of a device that may have capacitors formed in accordance with the embodiments described above and illustrated, for example in FIG. 3(D). A variety of other system components, including, but not limited to input/output devices, controllers, memory and other components, may also include structures formed in accordance with the embodiments described above. The system components may be formed on the motherboard, or may be disposed on other cards such as daughter cards or expansion cards.

The storage 206 may comprise an internal storage device or an attached or network accessible storage. Programs in the storage 206 may be loaded into the memory 204 and executed by the CPU 202 in a manner known in the art. The architecture may further include a network controller 208 to enable communication with a network, such as an Ethernet, a Fibre Channel Arbitrated Loop, etc. Further, the architecture may, in certain embodiments, also include a video controller 209, to render information on a display monitor, where the video controller may be embodied on a video card or integrated on integrated circuit components mounted on the motherboard, for example. Other controllers may also be present to control other devices.

An input device 210 may be used to provide input to the CPU 202, and may include, for example, a keyboard, mouse, pen-stylus, microphone, touch sensitive display screen, or any other suitable activation or input mechanism. An output device 212 including, for example, a monitor, printer, speaker, etc., capable of rendering information transmitted from the CPU 202 or other component, may also be present.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A device comprising:
   a capacitor comprising a first and second electrode and a capacitor dielectric between the first and second electrodes;
   wherein at least one of the first and second electrodes comprise a plurality of carbon nanotubes coupled thereto; and
   wherein the plurality of the carbon nanotubes are in direct physical contact with the capacitor dielectric.

2. The device of claim 1, wherein at least a portion of the plurality of carbon nanotubes are at least partially coated with a metal.

3. The device of claim 2, wherein the first and second electrodes each comprise at least one metal selected from the group consisting of nickel, iron, cobalt, molybdenum, and ruthenium.

4. The device of claim 2, wherein the carbon nanotubes extend in a direction that is substantially perpendicular to the electrode that the carbon nanotubes are coupled thereto.

5. The device of claim 2, wherein the first electrode and the second electrode both include a plurality of carbon nanotubes coupled thereto.

6. The device of claim 2, further comprising a metal layer on a substrate and an interlayer dielectric layer on the metal layer, wherein the first electrode is positioned on the interlayer dielectric layer, and wherein the first electrode is positioned between the interlayer dielectric layer and the capacitor dielectric layer.

7. The device of claim 6, wherein the substrate comprises an organic material, and the capacitor dielectric comprises a polymer.

8. The device of claim 1, wherein the device comprises a computer system including:
 a central processing unit which includes the capacitor on a substrate;
 a memory electronically coupled to the central processing unit;
 an input device electronically coupled to the central processing unit;
 an output device electronically coupled to the central processing unit; and
 a video controller electronically coupled to the central processing unit.

9. The device of claim 1, wherein the capacitor dielectric comprises the plurality of carbon nanotubes.

* * * * *